(12) United States Patent
Novak

(10) Patent No.: US 7,414,794 B2
(45) Date of Patent: Aug. 19, 2008

(54) OPTICAL ARRANGEMENT OF AUTOFOCUS ELEMENTS FOR USE WITH IMMERSION LITHOGRAPHY

(75) Inventor: W. Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/234,279

(22) Filed: Sep. 26, 2005

(65) Prior Publication Data

US 2006/0017900 A1   Jan. 26, 2006

Related U.S. Application Data

(63) Continuation of application No. PCT/US2004/011287, filed on Apr. 12, 2004.

(60) Provisional application No. 60/464,392, filed on Apr. 17, 2003.

(51) Int. Cl.
*G02B 3/12* (2006.01)

(52) U.S. Cl. .................... 359/649; 359/358; 359/665; 250/201.2; 355/56

(58) Field of Classification Search ................ 359/649, 359/358, 665; 355/56; 250/201.2, 201.3
See application file for complete search history.

(56) References Cited

U.S. PATENT DOCUMENTS

| | | | |
|---|---|---|---|
| 3,721,827 A | 3/1973 | Reinheimer | |
| 4,346,164 A | 8/1982 | Tabarelli et al. | |
| 4,480,910 A | 11/1984 | Takanashi et al. | |
| 5,365,051 A | 11/1994 | Suzuki et al. | |
| 5,448,332 A | 9/1995 | Sakakibara et al. | |
| 5,610,683 A | 3/1997 | Takahashi | |
| 5,677,525 A | 10/1997 | Volcker et al. | |
| 5,715,039 A | 2/1998 | Fukuda et al. | |
| 5,825,043 A | * 10/1998 | Suwa | 250/548 |
| 6,633,365 B2 | 10/2003 | Suenaga | |
| 6,809,794 B1 | 10/2004 | Sewell | |

(Continued)

FOREIGN PATENT DOCUMENTS

DE    221 563 A1    4/1985

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner*—Joseph Martinez
(74) *Attorney, Agent, or Firm*—Oliff & Berridge, PLC

(57) ABSTRACT

An autofocus unit is provided to an immersion lithography apparatus in which a fluid is disposed over a target surface of a workpiece and an image pattern is projected onto this target surface through the fluid. The autofocus unit has an optical element such as a projection lens disposed opposite and above the target surface. An autofocus light source is arranged to project a light beam obliquely at a specified angle such that this light beam passes through the fluid and is reflected by the target surface of the workpiece at a specified reflection position that is below the optical element. A receiver receives and analyzes the reflected light. Correction lenses may be disposed on the optical path of the light beam for correcting propagation of the light beam.

20 Claims, 6 Drawing Sheets

U.S. PATENT DOCUMENTS

| | | | |
|---|---|---|---|
| 7,193,232 B2 * | 3/2007 | Lof et al. | 250/548 |
| 7,199,858 B2 * | 4/2007 | Lof et al. | 355/30 |
| 2002/0163629 A1 | 11/2002 | Switkes et al. | |
| 2003/0030916 A1 | 2/2003 | Suenaga | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0109237 A1 | 6/2004 | Epple et al. | |
| 2004/0113043 A1 | 6/2004 | Ishikawa et al. | |
| 2004/0114117 A1 | 6/2004 | Blecker | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2005/0024609 A1 | 2/2005 | De Smit et al. | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046934 A1 | 3/2005 | Ho et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0141098 A1 | 6/2005 | Schuster | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219499 A1 | 10/2005 | Zaal et al. | |
| 2005/0225737 A1 | 10/2005 | Weissenrieder et al. | |
| 2005/0263068 A1 | 12/2005 | Hoogendam et al. | |
| 2005/0270505 A1 | 12/2005 | Smith | |

FOREIGN PATENT DOCUMENTS

| | | |
|---|---|---|
| DE | 224 448 A1 | 7/1985 |
| EP | 1 571 696 A1 | 9/2005 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A-6-124873 | 5/1994 |
| JP | A-7-220990 | 8/1995 |
| JP | A-8-316125 | 11/1996 |
| JP | A-10-303114 | 11/1998 |
| JP | A-10-340846 | 12/1998 |
| JP | A-11-176727 | 7/1999 |
| JP | A-2000-58436 | 2/2000 |
| WO | WO99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/053954 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A1 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |

| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, $3^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages. (slides 1-51).

Nikon Corporation, NGL Workshop, Jul. 10, 2003, :Potential performance and feasibility of immersion lithography, Soichi Owa et al., 33 pages, slides 1-33.

* cited by examiner

OPTICAL ARRANGEMENT OF AUTOFOCUS ELEMENTS FOR USE WITH IMMERSION LITHOGRAPHY

CROSS-REFERENCE TO RELATED APPLICATIONS

This is a Continuation of International Application No. PCT/US2004/011287 filed Apr. 12, 2004, which claims the benefit of U.S. Provisional Patent Application No. 60/464,392 filed Apr. 17, 2003. The disclosures of these applications are incorporated by reference herein in their entireties.

BACKGROUND

This invention relates to an optical arrangement of autofocus elements for use with immersion lithography.

In semiconductor lithography systems in use today, automatic focusing and leveling (AF/AL) is typically accomplished by passing a low angle of incidence optical beam onto the surface of a silicon wafer and detecting its properties after subsequent reflection from the wafer surface. The wafer height is determined by optical and electrical processing of the reflected light beam. This beam passes under the last element of the projection lens. The source and receiver optics are typically mounted to a stable part of the system, close to the projection optics mounting position.

In immersion lithography, a liquid such as water fills the space between the last surface of the projection lens and the wafer. At the edge of the water, typically at the edge of the lens or supported structure near the edge of the lens, the liquid-air boundary is not well defined and is changing rapidly. It is not possible to transmit an AF/AL beam through this interface without substantial disruption and subsequent loss of signal, and hence performance.

It is therefore a general object of this invention to provide a way to introduce AF/AL beams into the liquid layer without such disruption so as to preserve the optical accuracy and stability required.

More specifically, it is an object of this invention to provide an apparatus and a method for allowing AF/AL light beams to be used as in conventional lithography without the disrupting influence of the liquid immersion boundary at the edge of the lens.

SUMMARY

Autofocus units according to this invention are for an immersion lithography apparatus that may be described generally as comprising a reticle stage arranged to retain a reticle, a working stage arranged to retain a workpiece having a target surface, an optical system including an illumination source and an optical element such as a lens positioned opposite and above the workpiece for projecting an image pattern of the reticle onto the workpiece by radiation from the illumination source, and a fluid-supplying device for providing a fluid into the space defined between the optical element and the workpiece such that the fluid contacts both the optical element and the target surface of the workpiece. The optical element positioned opposite to the workpiece may be treated as a component of the autofocus unit itself which may be characterized as further comprising an autofocus light source serving to project a light beam obliquely at a specified angle such that this light beam passes through the fluid and is reflected by the target surface of the workpiece at a specified reflection position that is below the optical element, and a receiver for receiving and analyzing the light beam reflected by the target surface. Correction lenses preferably may be disposed on the optical path of the light beam projected from the autofocus light source for correcting propagation of the light beam.

As an alternative embodiment, the optical element opposite the workpiece may be cut on its two mutually opposite sides, and optically transparent wedge-shaped elements may be placed under these cuts such that the light beam from the autofocus light source will pass through them as it is passed through the fluid to be reflected on the target surface of the workpiece and to reach the receiver without passing through the optical element at all. In order to cope with the potential problem of bubbles that may be formed due to the gap between the wedge element and the optical element, the gap may be filled with a suitable material, made sufficiently narrow such as less than 2.0 mm such that capillary forces will keep the gap filled with the fluid, or provided with means for supplying a small suction to cause the fluid to move up through the gap or to supply the fluid such that the gap can be kept filled. The boundary surface through which the light beam from the autofocus light source is refracted into the fluid from the interior of the wedge element need not be parallel to the target surface of the workpiece, but may be appropriately sloped, depending on the indices of refraction of the materials that affect the design of the unit.

BRIEF DESCRIPTION OF THE DRAWINGS

The invention will be described in conjunction with the accompanying drawings of exemplary embodiments in which like reference numerals designate like elements, and in which.

DETAILED DESCRIPTION OF EMBODIMENTS

Figure 1:
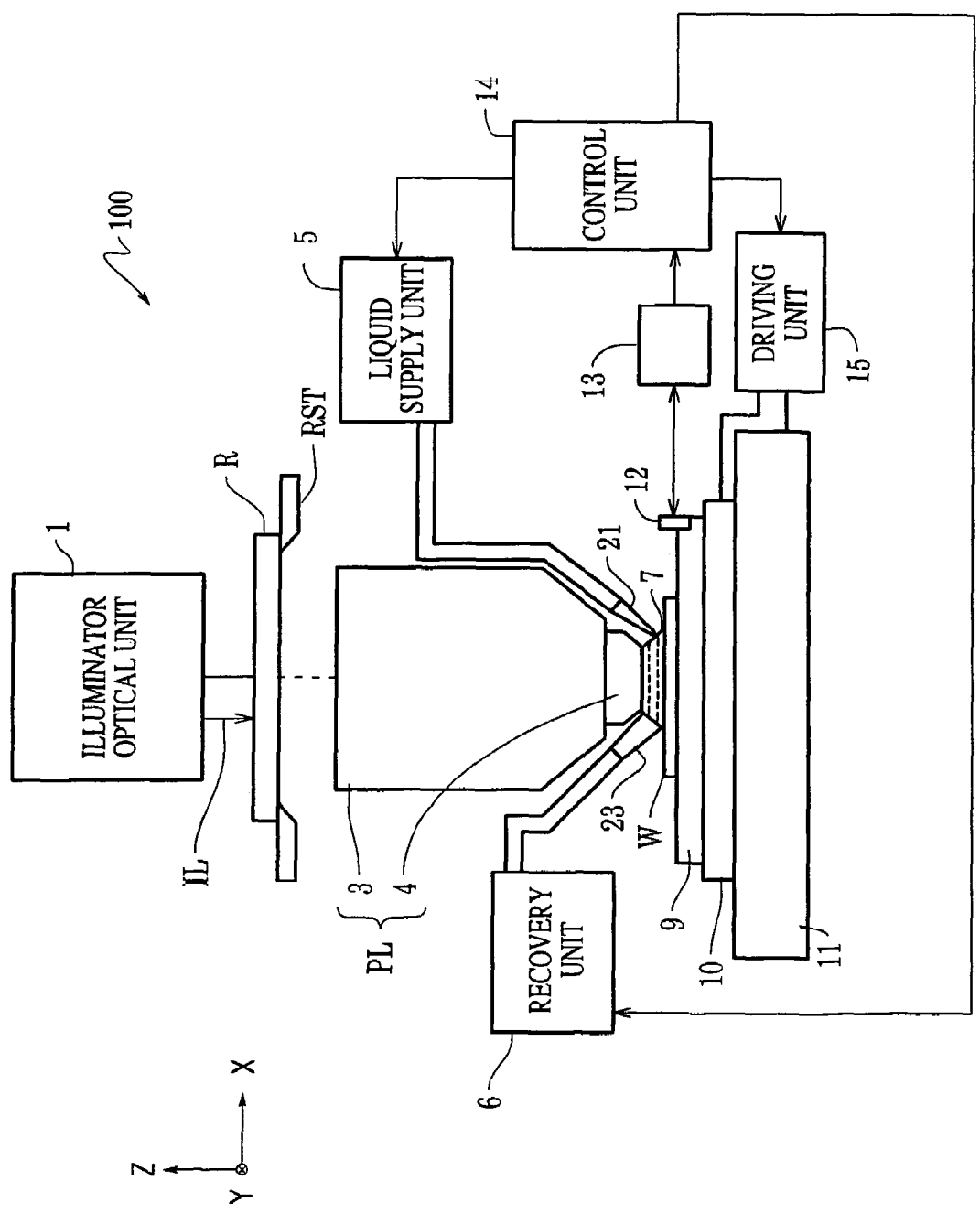
FIG. 1 is a schematic cross-sectional view of an immersion lithography apparatus that incorporates the invention.

FIG. 1 shows the general structure of an immersion lithography apparatus 100 that may incorporate the optical arrangement of autofocus elements embodying this invention.

As shown in FIG. 1, the immersion lithography apparatus 100 comprises an illuminator optical unit 1 including a light source such as a KrF excimer laser unit, an optical integrator (or homogenizer) and a lens and serving to emit pulsed ultraviolet light IL with wavelength 248 nm to be made incident to a pattern on a reticle R. The pattern on the reticle R is projected onto a wafer W coated with a photoresist at a specified magnification (such as ¼ or ⅕) through a telecentric light projection unit PL. The pulsed light IL may alternatively be ArF excimer laser light with wavelength 193 nm, $F_2$ laser light with wavelength 157 nm or the i-line of a mercury lamp with wavelength 365 nm. In what follows, the coordinate system with X-, Y- and Z-axes as shown in FIG. 1 is referenced to explain the directions in describing the structure and functions of the lithography apparatus 100. For the convenience of disclosure and description, the light projection unit PL is illustrated in FIG. 1 only by way of its last-stage optical element (such as a lens) 4 disposed opposite to the wafer W and a cylindrical housing 3 containing all others of its components.

The reticle R is supported on a reticle stage RST incorporating a mechanism for moving the reticle R by some amount in the X-direction, the Y-direction and the rotary direction around the Z-axis. The two-dimensional position and orientation of the reticle R on the reticle stage RST are detected by a laser interferometer (not shown) in real time and the positioning of the reticle R is affected by a main control unit 14 on the basis of the detection thus made.

The wafer W is set on a wafer holder (not shown) on a Z-stage 9 for controlling the focusing position (along the Z-axis) and the sloping angle of the wafer W. The Z-stage 9 is affixed to an XY-stage 10 adapted to move in the XY-plane substantially parallel to the image-forming surface of the light projection unit PL. The XY-stage 10 is set on a base 11. Thus, the Z-stage 9 serves to match the wafer surface with the image surface of the light projection unit PL by adjusting the focusing position (along the Z-axis) and the sloping angle of the wafer W by the auto-focusing and auto-leveling method, and the XY-stage 10 serves to adjust the position of the wafer W in the X-direction and the Y-direction.

The two-dimensional position and orientation of the Z-stage 9 (and hence also of the wafer W) are monitored in real time by another laser interferometer 13 with reference to a mobile mirror 12 affixed to the Z-stage 9. Control data based on the results of this monitoring are transmitted from the main control unit 14 to a stage-driving unit 15 adapted to control the motions of the Z-stage 9 and the XY-stage 10 according to the received control data. At the time of an exposure, the projection light is made to sequentially move from one to another of different exposure positions on the wafer W according to the pattern on the reticle R in a step-and-repeat routine.

The lithography apparatus 100 described with reference to FIG. 1 is an immersion lithography apparatus and is hence adapted to have a liquid (or the "immersion liquid") 7 of a specified kind such as water filling the space between the surface of the wafer W and the lower surface of the last-stage optical element 4 of the light projection unit PL at least while the pattern image of the reticle R is being copied onto the wafer W.

The last-stage optical element 4 of the light projection unit PL is affixed to the cylindrical housing 3. In an optional embodiment, the last-stage optical element 4 may be made removable for cleaning or maintenance.

The liquid 7 is supplied from a liquid supply unit 5 that may comprise a tank, a pressure pump and a temperature regulator (not individually shown) to the space above the wafer W under a temperature-regulated condition and is collected by a liquid recovery unit 6. The temperature of the liquid 7 is regulated to be approximately the same as the temperature inside the chamber in which the lithography apparatus 100 itself is disposed. Numeral 21 indicates source nozzles through which the liquid 7 is supplied from the supply unit 5. Numeral 23 indicates recovery nozzles through which the liquid 7 is collected into the recovery unit 6. The structure described above with reference to FIG. 1 is not intended to limit the scope of the immersion lithography apparatus to which the methods and devices of the invention are applicable. In other words, autofocus units of the invention may be incorporated into immersion lithography apparatus of many different kinds. In particular, the numbers and arrangements of the source and recovery nozzles 21 and 23 around the light projection unit PL may be designed in a variety of ways for establishing a smooth flow and quick recovery of the immersion liquid 7.

Figure 4:
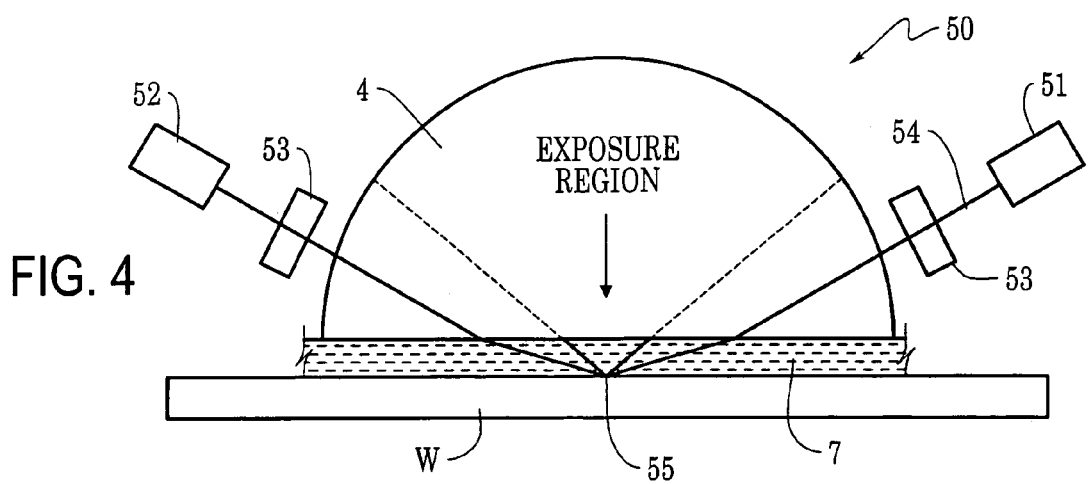
FIG. 4 is a schematic side cross-sectional view of an autofocus unit embodying this invention.

FIG. 4 shows an autofocus unit 50 (not shown in FIG. 1) according to this invention which may be incorporated into an immersion lithography system such as shown at 100 in FIG. 1, but the invention is not intended to be limited by the specific type of the system into which it is incorporated. In this example, the last-stage optical element 4 of the light projection unit PL is a hemispherically shaped projection lens with its planar surface facing downward opposite to the upper surface (the "target surface") of the wafer W, with a space left in between. An autofocus light source 51 is arranged such that its AF/AL light beam 54, emitted obliquely with respect to the target surface of the wafer W, passes through a lower peripheral part of this lens 4 and then is refracted into the immersion liquid 7 so as to be reflected by the target surface of the wafer W at a specified reflection position 55. A receiver 52 for receiving and analyzing the reflected AF/AL light beam 54 is appropriately positioned on the opposite side of the light projection unit PL. Numerals 53 each indicate what may be referred to as a correction lens disposed on the path of the AF/AL light beam 54 for correcting light propagation. Since the interface between the lens 4 and the liquid 7 is well defined and essentially free of bubbles, the light beams are unimpeded and can provide good signals to maintain high accuracy. In FIG. 4, broken lines indicate the exposure light cone, or the boundary of the exposure region.

Figure 5:
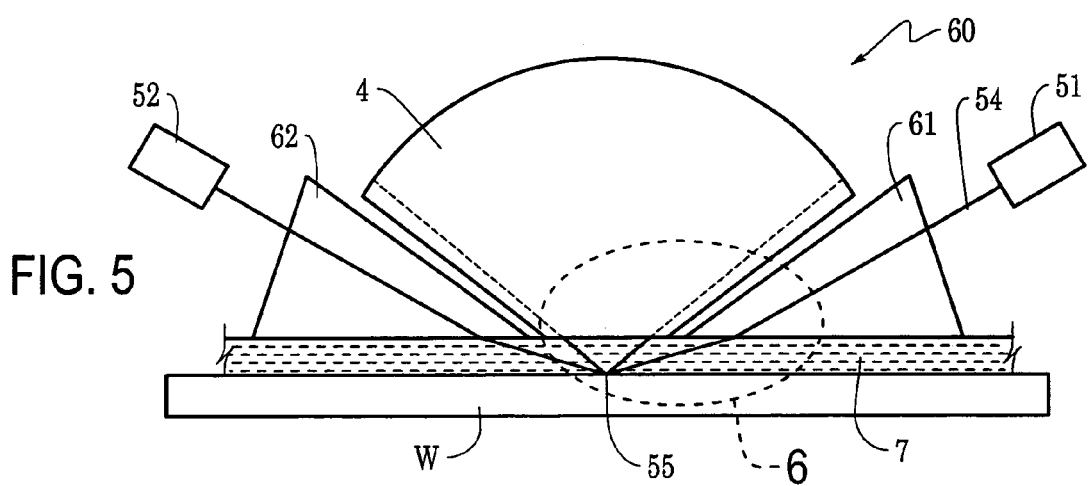
FIG. 5 is a schematic side cross-sectional view of another autofocus unit embodying this invention.

FIG. 5 shows another autofocus unit 60 according to another embodiment of the invention. Its components that are similar to those described above with reference to FIG. 5 are indicated by the same numerals. The unit 60 shown in FIG. 5 is characterized as having the lower surface of the last-stage optical element 4 of the light projection unit PL cut in two places facing respectively the autofocus light source 51 and the receiver 52. The cut surfaces preferably may be flat, as shown in FIG. 5, and the last-stage optical element 4 is still functionally and essentially a hemispherical lens. Optically transparent parts, referred to as wedge elements 61 and 62, are placed on both sides of the lens 4 under these cut surfaces, the element 61 being on the side of the autofocus light source 51 and the element 62 being on the side of the receiver 52. The cuts and the wedge elements 61 and 62 are designed so that the AF/AL light beam 54 from the autofocus light source 51 will pass through the wedge element 61 and be refracted into the immersion liquid 7 without passing through the lens 4 and, after being reflected by the target surface of the wafer W at the reflection position 55, will be refracted into the wedge element 62 and received by the receiver 52 again without passing through the lens 4. This embodiment is advantageous because the wedge elements can be made of a different material from the lens element 4, such as optical glass.

Figure 6:
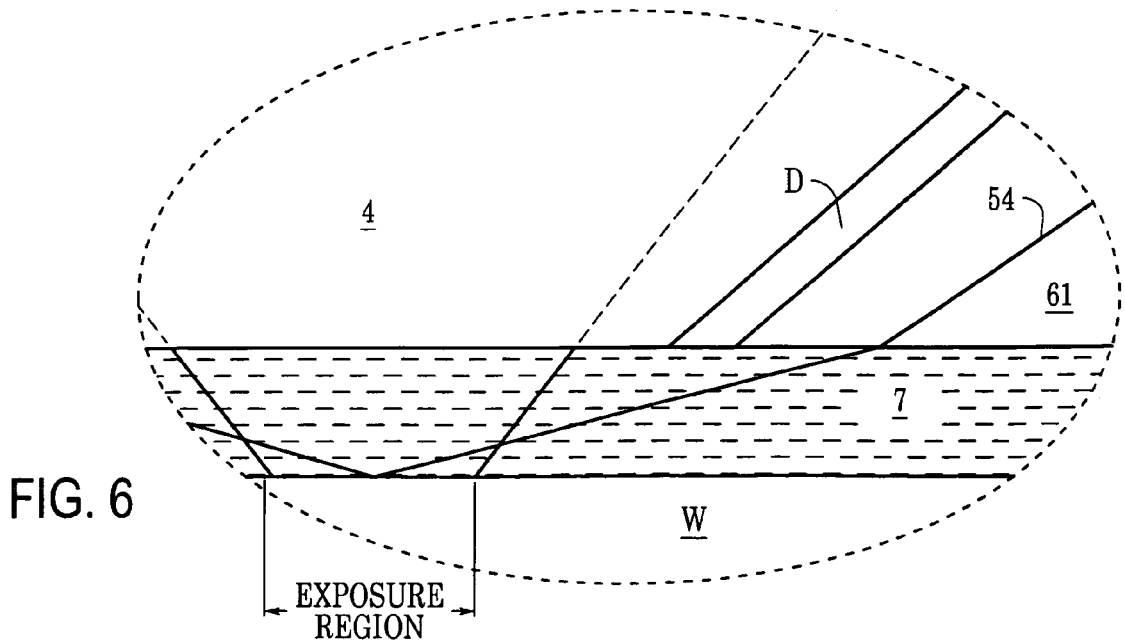
FIG. 6 is an enlarged view of a circled portion 6 of FIG. 5.

The lower interface between the wedge elements 61 and 62 and the lens 4 is important from the points of view of correct optical performance and generation of bubbles in the immersion liquid 7. With reference to FIG. 6, which shows in more detail the portion of the wedge element 61 in a close proximity of the lens 4, the gap D therebetween is a potential source of air bubbles, which may be entrained under the lens 4, adversely affecting its optical performance.

Figure 7:
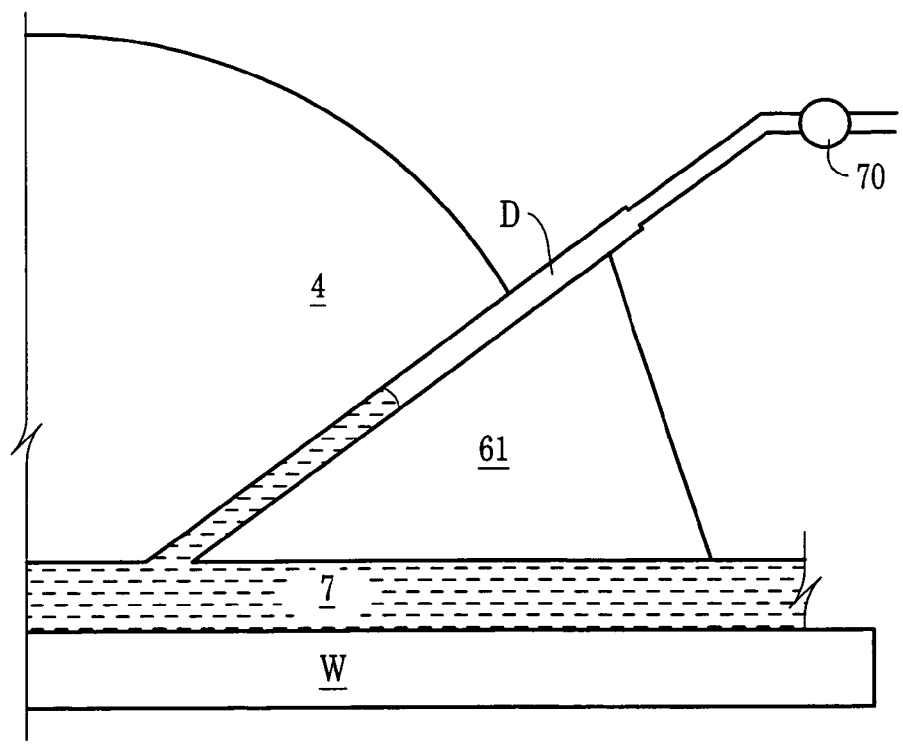
FIGS. 7, 8 and 9 are schematic side cross-sectional views of portions of other autofocus units embodying this invention according to different embodiment of the invention.
Figure 8:
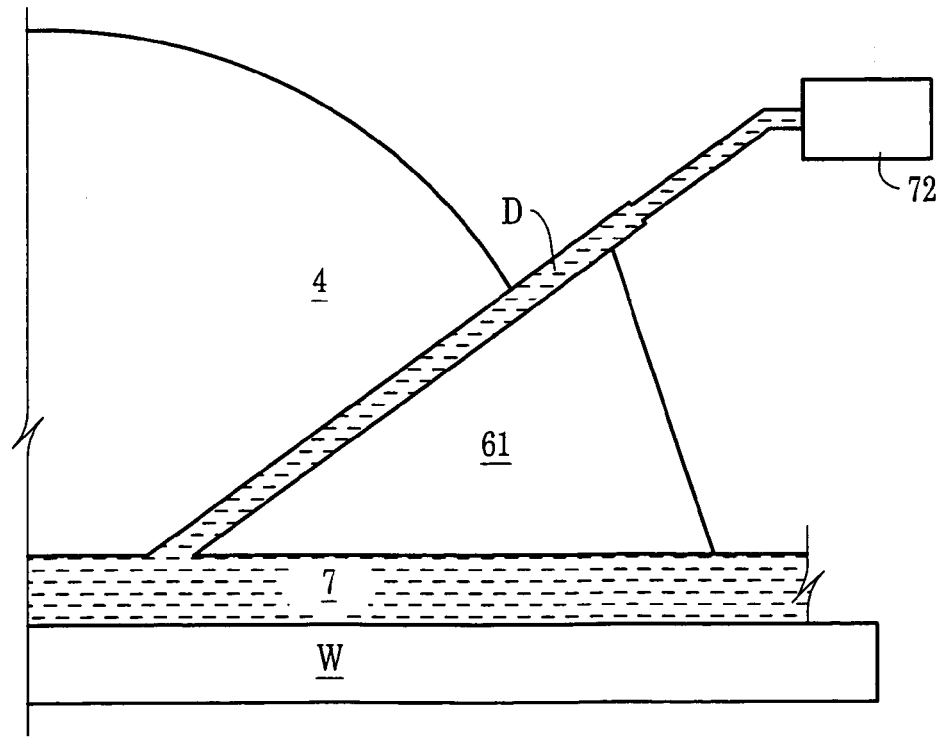

One of the solutions to this problem is to fill the gap with a suitable material or to press the wedge element 61 into contact with the lens 4 such that the gap D becomes effectively zero and therefore does not perturb the liquid interface. Another solution is to keep D approximately equal to or less than 2.0 mm such that capillary forces cause the liquid 7 to fill the gap and keep it filled even while the wafer W is moved under the lens 4. A third solution is to supply a small suction to cause the liquid 7 to move up inside the gap D and to prevent air from moving downward, as shown in FIG. 7 in which numeral 70 indicates an air pump for providing the suction. FIG. 8 shows still another solution whereby a source 72 of the liquid 7 is supplied above the opening of the gap D to keep the gap D filled with the liquid 7.

Figure 9:
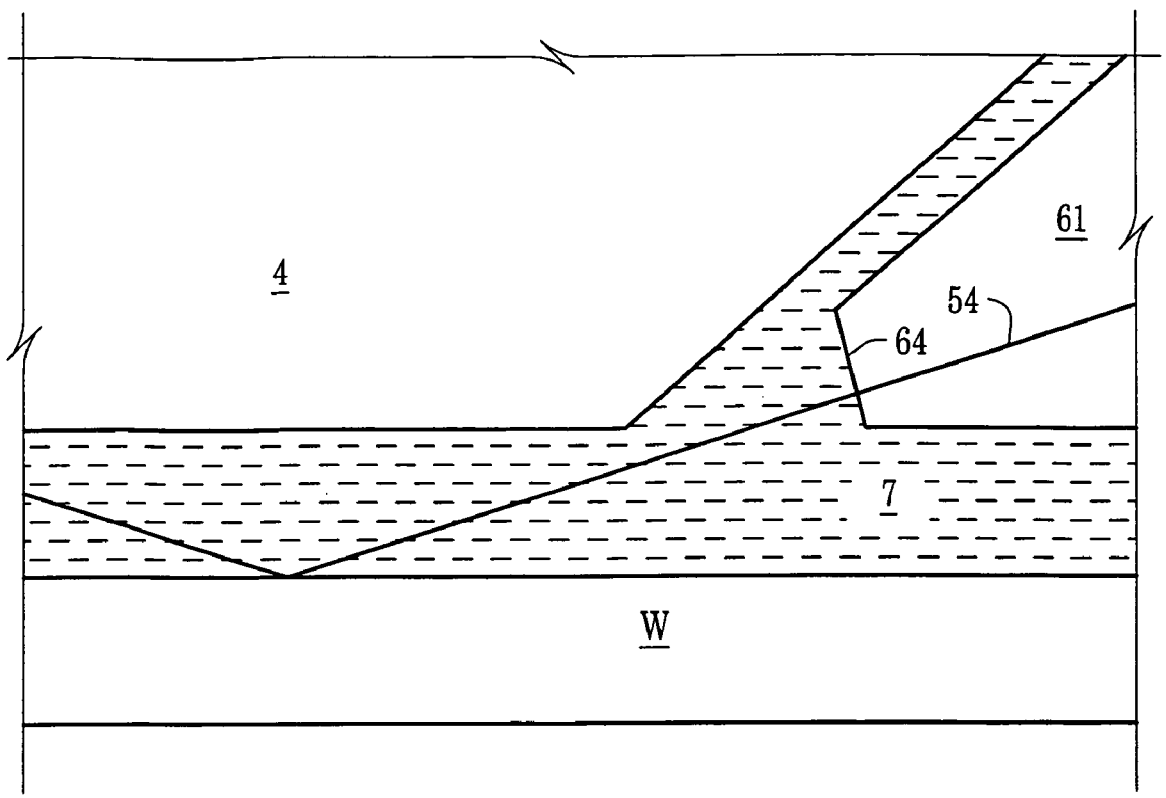

The invention has been described above with reference to only a limited number of arrangements, but they are not intended to limit the scope of the invention. Many modifications and variations are possible within the scope of the invention. The shape of the wedge elements 61 and 62, for example, need not be as described above with reference to FIG. 6. Depending, for example, upon the desired angle of incidence of the AF/AL light beam 54 relative to the indices of refraction of the immersion liquid 7 and the material of the wedge element 61, it may be advantageous, as shown in FIG. 9, to provide the wedge element 61 with a sloped surface portion 64 such that the AF/AL light beam 54 passing through the wedge element 61 will be refracted into the immersion liquid 7, not necessarily through a horizontal boundary surface as shown in FIG. 6, but through this appropriately sloped surface portion 64. This will provide flexibility in the design of the arrangement embodying this invention.

Figure 2:
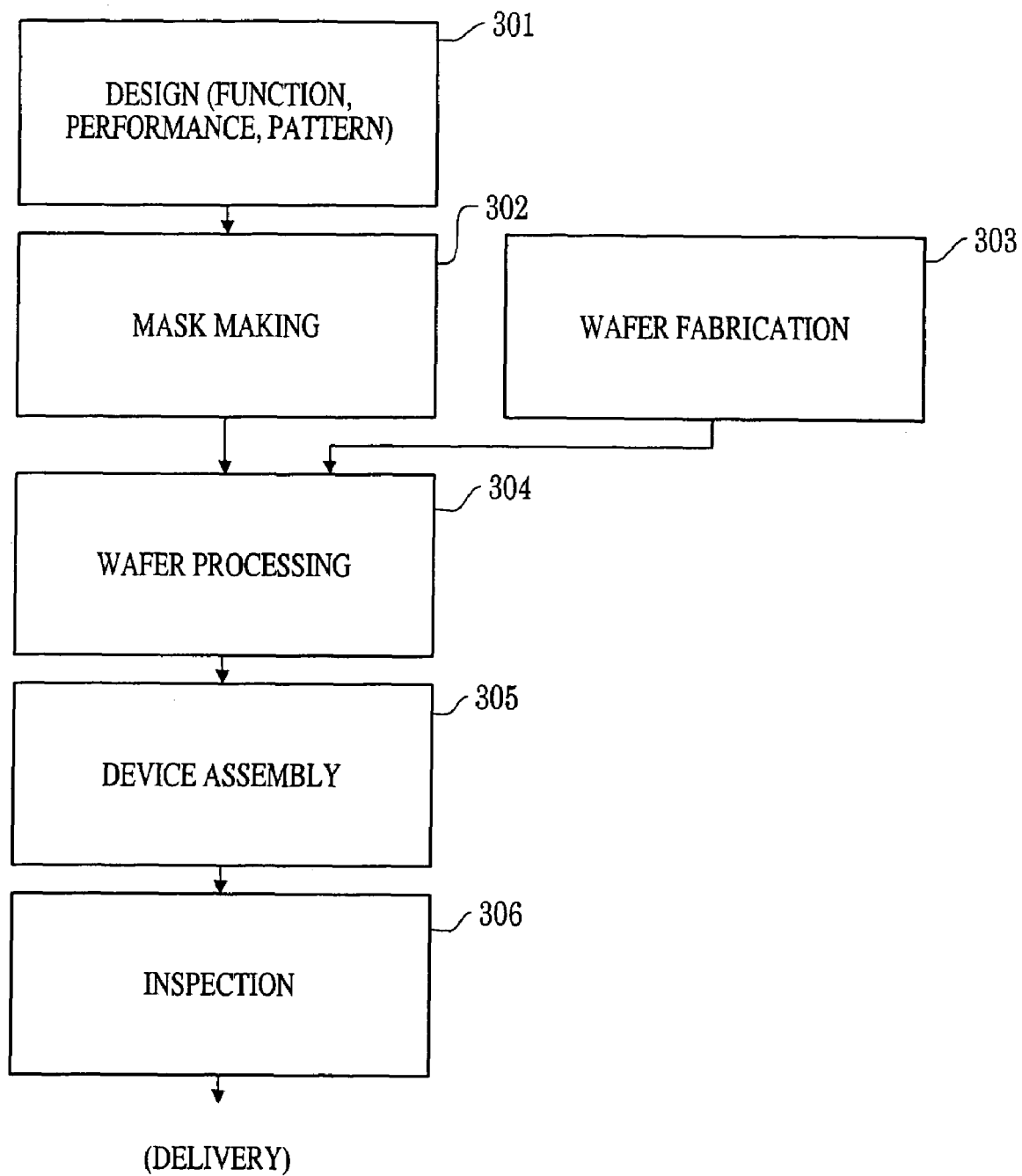
FIG. 2 is a process flow diagram illustrating an exemplary process by which semiconductor devices are fabricated using the apparatus shown in FIG. 1 according to the invention.

FIG. 2 is referenced next to describe a process for fabricating a semiconductor device by using an immersion lithography apparatus incorporating a liquid jet and recovery system embodying this invention. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
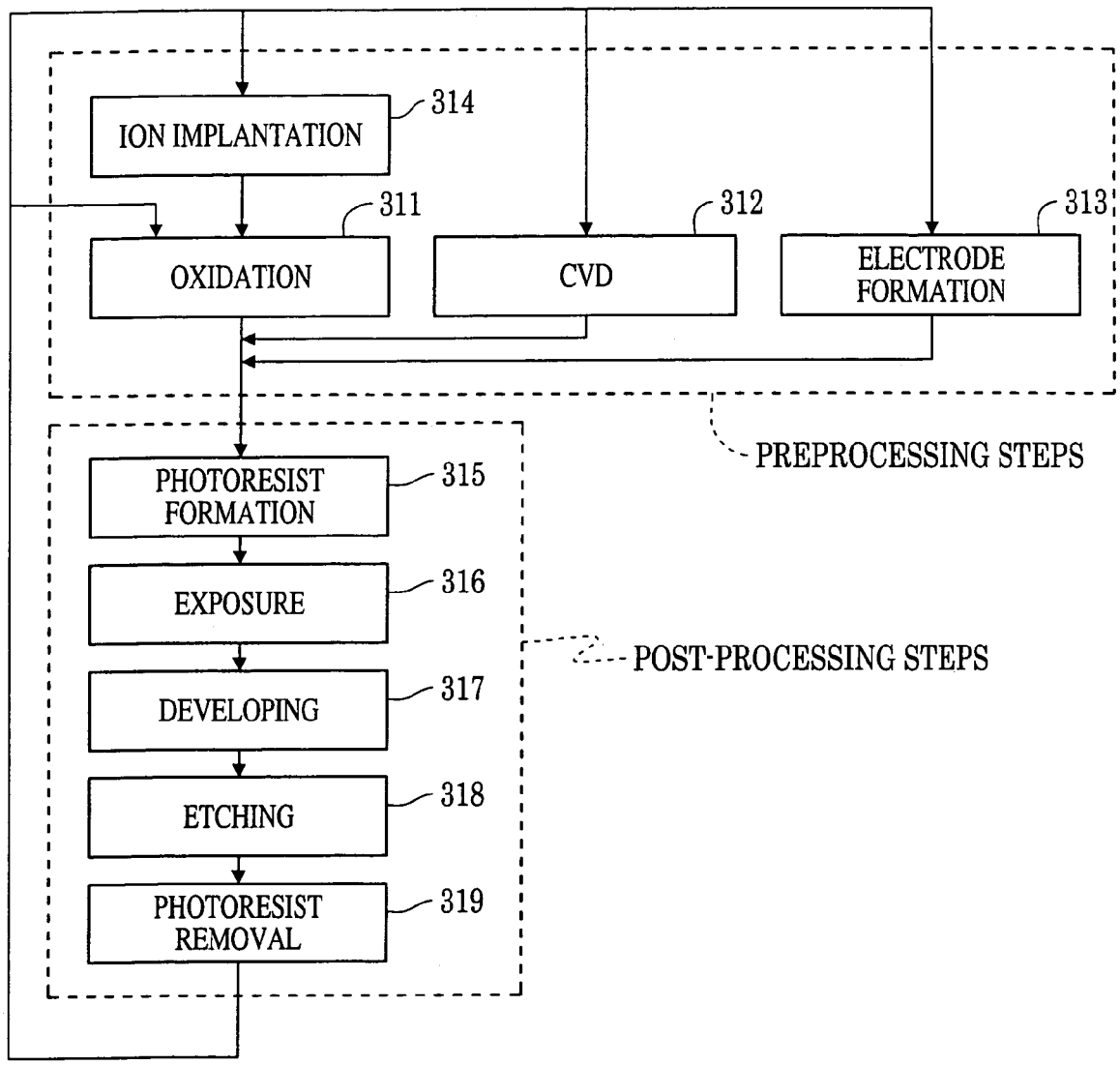
FIG. 3 is a flowchart of the wafer processing step shown in FIG. 2 in the case of fabricating semiconductor devices according to the invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The aforementioned steps 311-314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316 (exposure step), the above-mentioned exposure device is used to transfer the circuit pattern of a mask (reticle) onto a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

While a lithography system of this invention has been described in terms of several preferred embodiments, there are alterations, permutations, and various substitute equivalents that fall within the scope of this invention. There are many alternative ways of implementing the methods and apparatus of the invention.

What is claimed is:

1. An apparatus comprising:
   an optical element which projects an image onto a first surface of a workpiece positioned adjacent to the optical element, there being a gap between the first surface of the workpiece and the optical element, the gap being substantially filled with an immersion liquid;
   an autofocus system including:
      an autofocus light source that emits a light beam through the immersion liquid onto the first surface of the workpiece; and
      a receiver that receives the light beam reflected off the first surface of the workpiece; and
   a transparent element that causes the light beam to pass through an interface between the transparent element and the immersion liquid, wherein a vacuum is provided to a space between the transparent element and the optical element.

2. The apparatus of claim 1, wherein the transparent element controls the refraction of the light beam at the interface between the transparent element and the immersion liquid.

3. The apparatus of claim 2, wherein the refraction of the light beam at the interface ranges from 0 to 90 degrees.

4. The apparatus of claim 1, wherein the transparent element is made of a material selected from the group consisting of glass, plastic, calcium fluoride and fused silica.

5. The apparatus of claim 1, wherein the transparent element is of a shape selected from the group consisting of rectangles, squares, ovals, wedges and spheres.

6. The apparatus of claim 1, wherein the vacuum causes the immersion liquid to move up through the space between the transparent element and the optical element so that outside air is prevented from moving into the space.

7. A method in immersion lithography, the method comprising:
   providing a workpiece having a first surface;
   positioning the first surface of the workpiece adjacent to an optical element;
   projecting an image through the optical element onto the first surface, there being a gap between the first surface of the workpiece and the optical element;
   filling the gap substantially with an immersion liquid;
   passing an autofocus light beam from an autofocus light source through the immersion liquid onto the first surface of the workpiece; and
   receiving the light beam reflected off the first surface of the workpiece with a receiver, wherein the receiver receives the light beam through a transparent element that is separate from and positioned adjacent to the optical element, and wherein a vacuum is provided to a space between the optical element and the transparent element.

8. The method of claim 7, wherein the transparent element controls the refraction of the light beam at an interface between the transparent element and the immersion liquid.

9. The method of claim 8, wherein the refraction of the light beam at the interface ranges from 0 to 90 degrees.

10. The method of claim 7, wherein the transparent element is made of a material selected from the group consisting of glass, plastic, calcium fluoride and fused silica.

11. The method of claim 7, wherein the transparent element is of a shape selected from the group consisting of rectangles, squares, ovals, wedges and spheres.

12. The method of claim 7, wherein the vacuum causes the immersion liquid to move up through the space between the transparent element and the optical element so that outside air is prevented from moving into the space.

13. An immersion lithography apparatus comprising:
- a reticle stage that retains a reticle;
- a working stage that retains a workpiece having a first surface;
- an optical system including an optical element, the first surface of the workpiece being positioned adjacent to the optical element to project an image onto the first surface, there being a gap between the first surface of the workpiece and the optical element, the gap being substantially filled with an immersion liquid;
- an autofocus system including an autofocus light source that emits a light beam through the immersion liquid onto the first surface of the workpiece and a receiver that receives the light beam reflected off the first surface of the workpiece; and
- a transparent element that is separate from and positioned adjacent to the optical element,
- wherein the receiver receives the light beam through the transparent element and wherein a vacuum is provided to a space between the optical element and the transparent element.

14. The apparatus of claim 13, wherein the transparent element controls the refraction of the light beam at an interface between the transparent element and the immersion liquid.

15. The apparatus of claim 14, wherein the refraction of the light beam at the interface ranges from 0 to 90 degrees.

16. The apparatus of claim 13, wherein the transparent element is made of a material selected from the group consisting of glass, plastic, calcium fluoride and fused silica.

17. The apparatus of claim 13, wherein the transparent element is of a shape selected from the group consisting of rectangles, squares, ovals, wedges and spheres.

18. The apparatus of claim 13, wherein the vacuum causes the immersion liquid to move up through the space between the transparent element and the optical element so that outside air is prevented from moving into the space.

19. A method for making an object using a lithography process, wherein the lithography process utilizes the immersion lithography apparatus of claim 13.

20. A method for patterning a wafer using a lithography process, wherein the lithography process utilizes the immersion lithography apparatus of claim 13.

* * * * *